(12) United States Patent
Lee et al.

(10) Patent No.: US 7,872,925 B2
(45) Date of Patent: Jan. 18, 2011

(54) WIRED-OR TYPED PAGE BUFFER HAVING CACHE FUNCTION IN A NONVOLATILE MEMORY DEVICE AND RELATED METHOD OF PROGRAMMING

(75) Inventors: Sung Soo Lee, Sungnam-si (KR); Min Su Kim, Suwon-si (KR); Seung Jae Lee, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/354,915

(22) Filed: Jan. 16, 2009

(65) Prior Publication Data

US 2009/0122612 A1    May 14, 2009

Related U.S. Application Data

(62) Division of application No. 11/317,079, filed on Dec. 27, 2005, now Pat. No. 7,495,968.

(30) Foreign Application Priority Data

Jan. 10, 2005  (KR)  .................. 10-2005-0002191

(51) Int. Cl.
*G11C 7/10* (2006.01)
(52) U.S. Cl. .................. 365/189.05; 365/185.12; 365/185.22
(58) Field of Classification Search ............ 365/189.05, 365/185.12, 185.22, 225.7, 185.11, 185.17
See application file for complete search history.

(56) References Cited

U.S. PATENT DOCUMENTS

| 5,299,162 | A | 3/1994 | Kim et al. | |
|---|---|---|---|---|
| 5,638,326 | A | 6/1997 | Hollmer et al. | |
| 6,671,204 | B2* | 12/2003 | Im .................. | 365/185.12 |
| 7,149,130 | B2 | 12/2006 | Lee | |
| 7,379,333 | B2* | 5/2008 | Lee et al. ............ | 365/185.12 |
| 2003/0117856 | A1 | 6/2003 | Lee et al. | |
| 2005/0018488 | A1* | 1/2005 | Kim et al. .......... | 365/185.28 |
| 2005/0232019 | A1* | 10/2005 | Vorraro et al. ........ | 365/185.22 |
| 2006/0083063 | A1 | 4/2006 | Lee et al. | |
| 2006/0120152 | A1 | 6/2006 | Lee et al. | |

FOREIGN PATENT DOCUMENTS

| JP | 2004133993 | 4/2004 |
|---|---|---|
| KR | 1020000059746 A | 5/2003 |
| KR | 1020030033679 A | 5/2003 |
| KR | 1020040067195 A | 7/2004 |

* cited by examiner

*Primary Examiner*—Dang T Nguyen
(74) *Attorney, Agent, or Firm*—Volentine & Whitt, PLLC

(57) ABSTRACT

Disclosed is a page buffer having a wired-OR type structure and a cache function which is adapted for use in a nonvolatile semiconductor memory device and a method of programming same. The page buffer embeds the cache latch block in relation to the cache function. Moreover, the nonvolatile semiconductor memory device includes an output driver enabling an internal output line to be unidirectional driven, thereby enabling a program-verifying operation using the wired-OR scheme.

6 Claims, 15 Drawing Sheets (BL in programmable condition)

US 7,872,925 B2

WIRED-OR TYPED PAGE BUFFER HAVING CACHE FUNCTION IN A NONVOLATILE MEMORY DEVICE AND RELATED METHOD OF PROGRAMMING

CROSS-REFERENCE TO RELATED APPLICATION

This is a divisional of application Ser. No. 11/317,079 filed on Dec. 27, 2005, which is incorporated herein by reference in its entirety.

BACKGROUND OF THE INVENTION

1. Field of the Invention

Embodiments if the invention relate to nonvolatile semiconductor memory devices and related programming methods. More particularly, embodiments of the invention relate to a nonvolatile semiconductor memory device having a wired-OR page buffer and a related method of programming.

This application claims priority to Korean Patent Application No. 2005-02191 filed on Jan. 10, 2005, the subject matter of which is hereby incorporated by reference.

2. Discussion of Related Art

Generally, read and programming operations for memory cells in a nonvolatile semiconductor memory device are carried out by controlling bit line voltages corresponding to selected memory cells. In order to properly drive bit lines voltages during a read or programming operation, contemporary nonvolatile semiconductor memory device provide one or more page buffers to temporarily store the data to be programmed into or read from the memory cells.

Figure (FIG.) 1 is a diagram illustrating a conventional nonvolatile semiconductor memory device, and FIG. 2 is a diagram illustrating a typical column gate (YG) corresponding to one page buffer (PBP) shown in FIG. 1. The conventional semiconductor memory device nominally comprises a memory cell array 10 comprising a plurality of memory cells, connected to a plurality of "n" page buffers (PBP). Each page buffer (PBP) is connected to a global data line (GDL) through a column gate (YG).

Each page buffer (PBP) comprises a sense latch 150, precharge circuit 140, a bit line (BL) shielding block 120 and a BL bias circuit 110. In the conventional page buffer (PBP), data to be written to a selected memory cell is loaded and latched in sense latch 150. Data stored in sense latch 150 is thus provided to bit line BLe or BLo through BL shielding block 120 and BL bias circuit 110. Thereafter, a programming operation is performed relative to the selected memory cell. In similar fashion, data to be read from a selected memory cell is temporarily stored in sense latch 150. Data thus stored in sense latch 150 may be transferred to the global data line (GDL) in response to a column gate signal (not shown).

However, in the conventional nonvolatile semiconductor memory device, as illustrated in FIGS. 1 and 2, internal data lines (IDL) connect each page buffer (PBP) to the global data line (GDL) through a corresponding the column gate (YG). This data transmission path includes a sense latch node (NLATP) which is commonly used in read and programming operations for the memory device. In the illustrated example of a conventional nonvolatile semiconductor memory device, data stored at the sense latch node (NLATP) of the page buffer (PBP) may be "flipped" (i.e., logically inverted) by a charge sharing effect between the global data line (GDL) and the internal data lines (IDL).

This possibility requires that the conventional nonvolatile semiconductor memory device perform a program-verifying operation. This is typically accomplished using a Y-scanning scheme that confirms data for each memory cell on a memory cell by memory cell basis. As a result, the conventional nonvolatile semiconductor memory device suffers from temporally extended operation cycles as necessitated by the program-verifying operation.

In a separate vein, conventional nonvolatile semiconductor memory devices typically require a cache function whereby a next page of data to be programmed is loaded into a cache latch associated with each page buffer. This cache function is usually performed during a programming operation associated with a page of data that has previously been loaded. This cache function allows the programming speed for the memory device to be enhanced where sequential pluralities of data are programmed into a memory page.

SUMMARY OF THE INVENTION

Thus, in one embodiment, the invention provides a page buffer for a nonvolatile semiconductor memory device comprising a plurality of memory cells each storing data provided by a bit line, comprising; a main latch block comprising a main latch node adapted to store main latch data logically controlled in accordance with a response transmission node, and connected to the bit line, whereby the main latch data may be provided to the bit line, a cache latch block comprising a cache latch node adapted to store cache latch data logically controlled in accordance with input data, and connected to the response transmission node, whereby the cache latch data is provided to the response transmission node in response to a dumping control signal, and an output driver unidirectionally driving an internal output line in accordance with the main latch data, wherein the internal output line is electrically isolated from a transmission path associated with the input data, wherein the cache latch block is further adapted to load and store next input data to be programmed in one memory cell during a time period in which the main latch data is being programmed into the memory cell.

In another embodiment, the invention provides a page buffer for a nonvolatile semiconductor memory device comprising a plurality of memory cells each storing data provided by a bit line, comprising; a main latch block adapted to store main latch data and driving data onto the bit line in accordance with the main latch data, a cache latch block adapted to store cache latch data and provide data to the main latch block in accordance with the cache latch data in response to a dumping control signal, thereby storing the main latch data in the main latch block, and an output driver unidirectionally driving an internal output line in accordance with the main latch data, wherein the internal output line is adapted to transfer data to an external device and is electrically isolated from a transmission path associated with the input data.

In yet another embodiment, the invention provides a nonvolatile semiconductor memory device comprising; a memory cell array comprising a plurality of memory cells, each adapted to store data programmed via a corresponding bit line, a plurality of page buffers, each adapted to store data apparent on a corresponding bit line, and wherein each page buffer comprises, a main latch block adapted to store main latch data and drive the corresponding bit line in accordance with the main latch data, a cache latch block adapted to store cache latch data and provide cache latch data logically controlled in accordance with input data, whereby the cache latch data is provided to the main latch block in response to a dumping control signal, and an output driver unidirectionally driving the main latch data onto an internal output line data adapted to transfer data to an external device and being electrically isolated from a transmission path associated with the input data, and wherein the internal output line for a first page buffer in the plurality of page buffers is adapted to by driven in accordance with the main latch data stored in the first page buffer, regardless of the respective logical states of the main latch data for page buffers in the plurality of page buffers other than the first page buffer.

In still another embodiment, the invention provides a method of programming a nonvolatile semiconductor memory device comprising; a memory cell array having a plurality of memory cells, each memory cell storing data programmed via a corresponding bit line, a plurality of page buffers, each page buffer storing main latch data; and comprising a main latch block storing the main latch data, a cache latch block storing cache latch data, and an output driver unidirectionally driving the main latch data onto an internal output line, the method comprising; loading cache latch data into the cache latch block in accordance with a logical state of input data provided by an external source, dumping the main latch data into the main latch block in accordance with the cache latch data, and programming a memory cell with a corresponding bit line in accordance with the main latch data, loading next data in the cache latch block during the programming of the memory cell.

BRIEF DESCRIPTION OF THE DRAWINGS

Several embodiments of the invention are described hereafter with reference to the accompanying drawings, in which.

DESCRIPTION OF EXEMPLARY EMBODIMENTS

Figure 1:
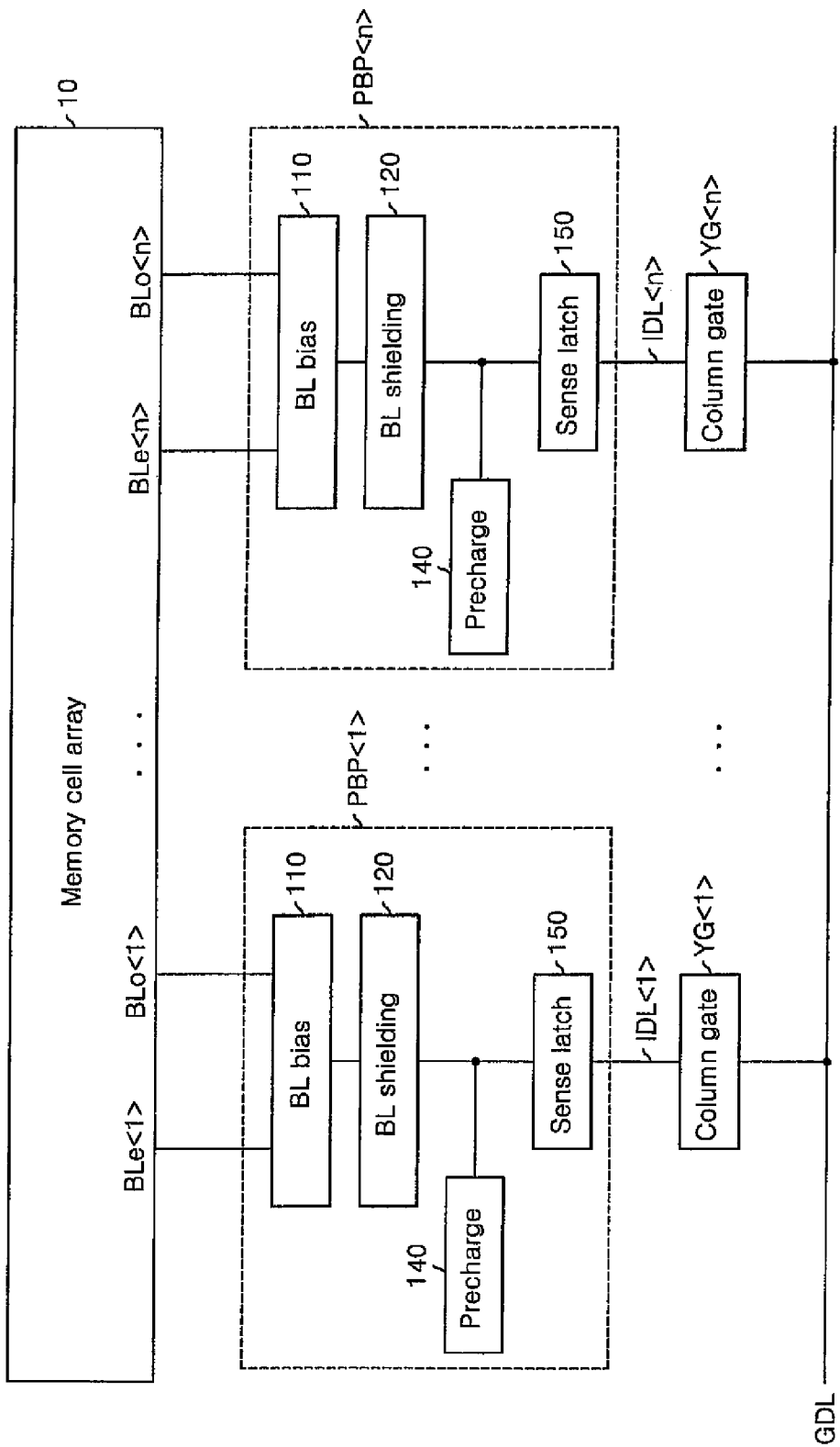
FIG. 1 is a diagram illustrating a conventional nonvolatile semiconductor memory device.
Figure 2:
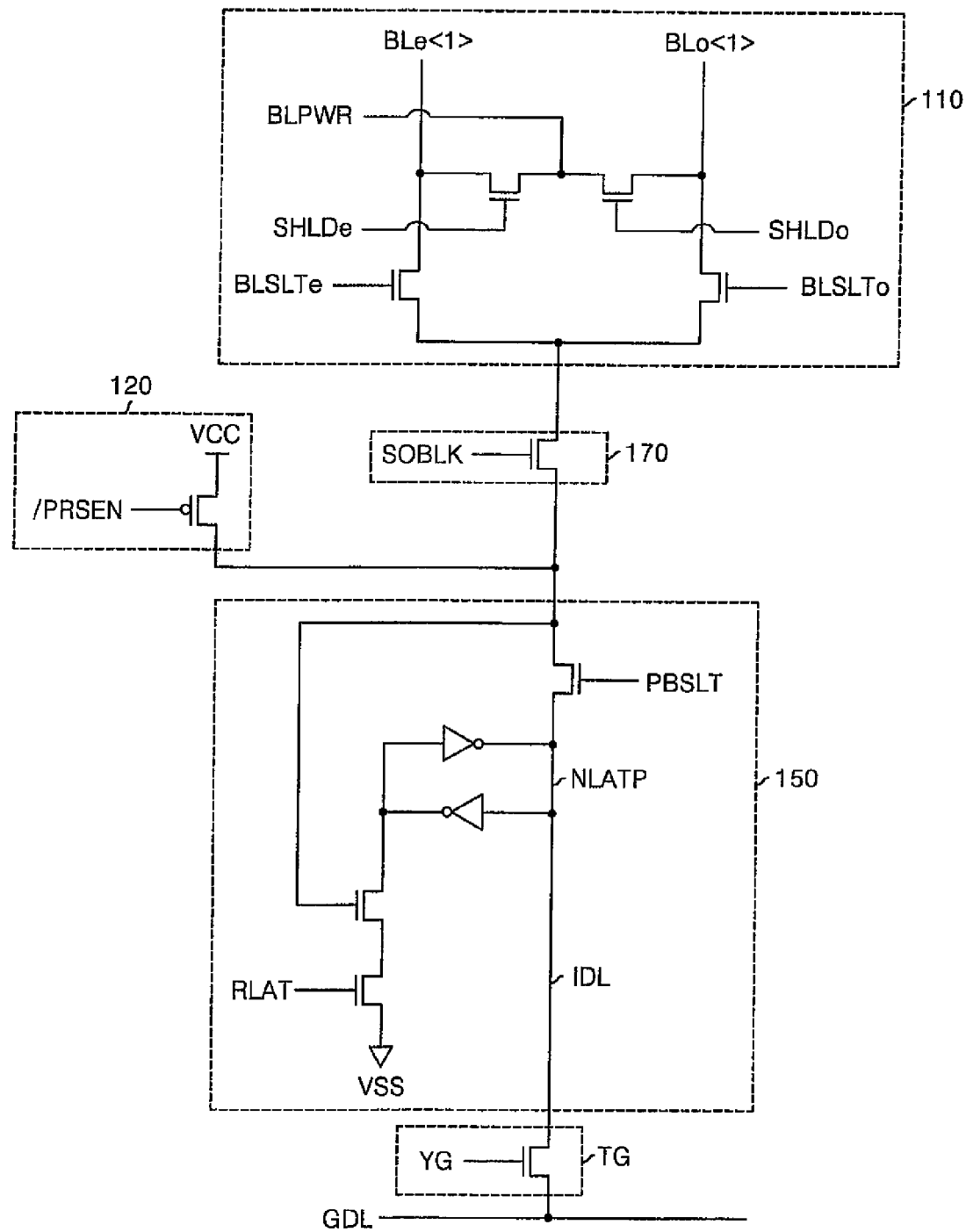
FIG. 2 is a diagram illustrating the a conventional column gate and page buffer structure of the conventional nonvolatile semiconductor memory device shown in FIG. 1.

Preferred embodiments of the present invention will be described below in some additional detail with reference to the accompanying drawings. The present invention may, however, be embodied in different forms and should not be constructed as being limited to only the embodiments set forth herein. In the drawings, like numerals refer to like or similar elements throughout the specification.

A page buffer in a nonvolatile semiconductor memory device (hereafter "memory device" for the sake of brevity), according to one or more embodiments of the invention, may comprise a main latch and a cache latch, wherein the cache latch is adapted to facilitate a constituent cache function. The term "cache function" as used in this context in relation to embodiments of the invention means any reasonable operation of memory device functionality through which next page data to be programmed in the memory device is loaded into the cache latch of a page buffer during at least part of the time period in which page data previously loaded is being programmed. By means of a cache function, multiple data pages may be sequentially programmed into the memory device with only a single set-up delay associated with the loading of the first data page. All other (e.g., second and subsequent) data pages subsequently programmed may be loaded in parallel with a programming operation associated with the preceding data page. Thus, the loading time required for the other data pages diminishes to the very brief time period required to "dump" the other data page from the cache latch to the main latch block. This procedure will be described hereinafter in some additional detail.

In the embodiment of the invention, two adjacent bit lines are configured to constitute a pair of bit lines. However, each bit line may be selected in relation to a unique column address. Therefore, in the illustrated embodiments described hereafter the two bit lines, (i.e., an even bit line and an odd bit line) will be referred to individually or collectively as a "bit line" without further differentiation.

Figure 3:
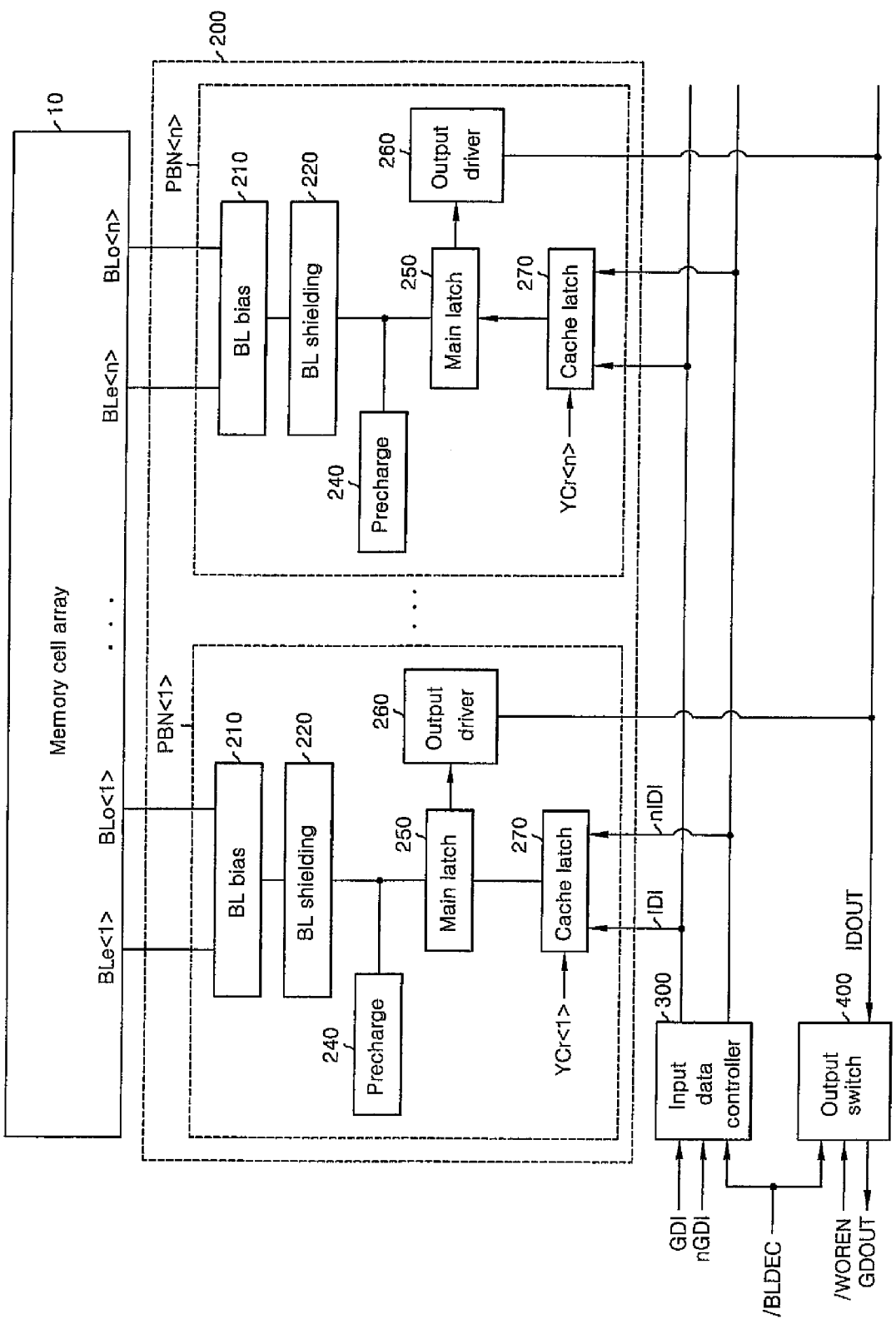
FIG. 3 is a diagram illustrating a nonvolatile semiconductor memory device in accordance with an embodiment of the present invention.

FIG. 3 is a diagram illustrating a memory device in accordance with one embodiment of the invention. As illustrated in FIG. 3, the memory device generally comprises of a memory cell array 10, a page buffer set 200, an input data controller 300, and an output switch 400.

Figure 4:
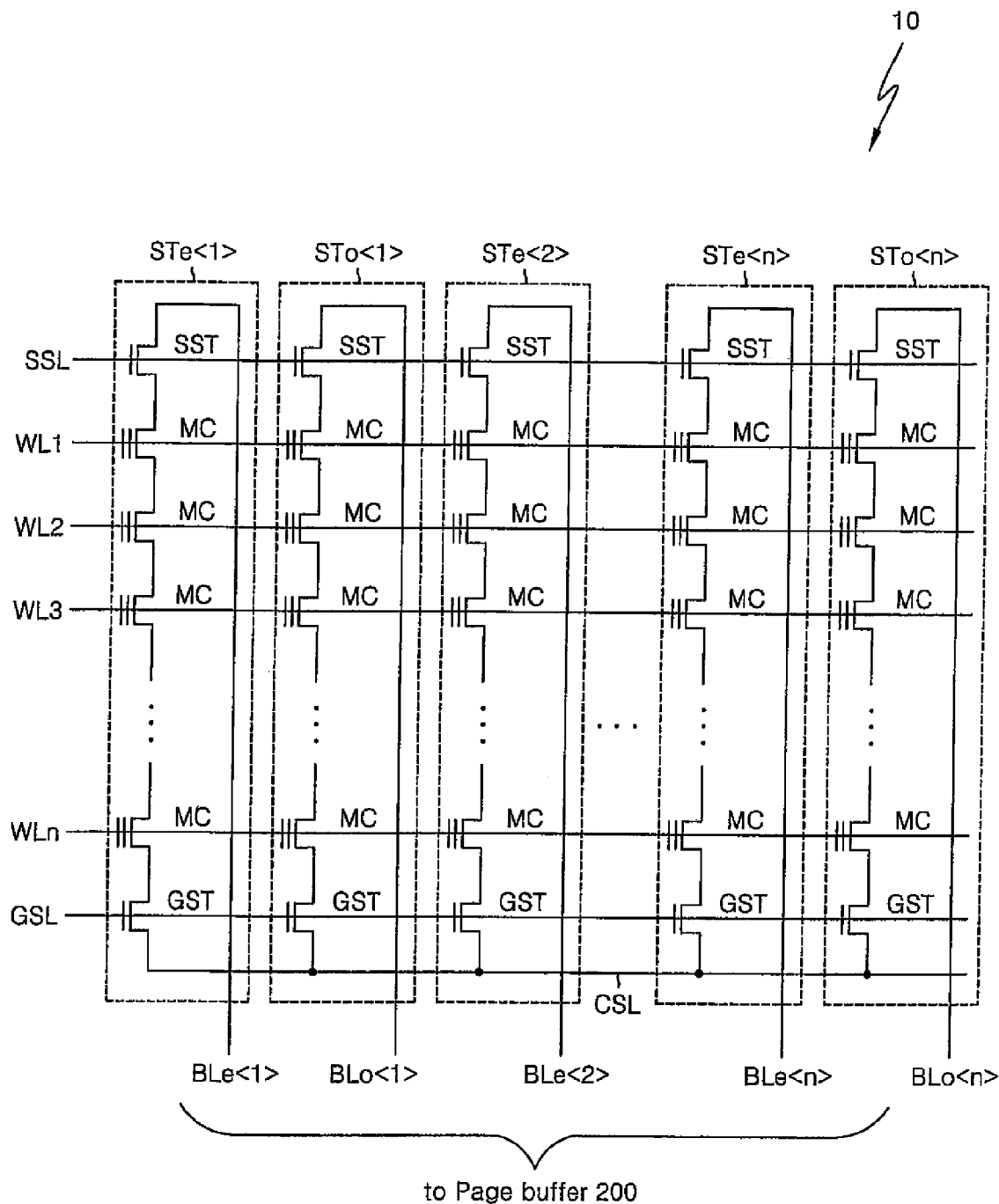
FIG. 4 is a diagram further illustrating a memory cell array shown in FIG. 3.

Memory cell array 10 comprises a plurality of even and odd grouped bit lines (BLe<n:1> and BLo<n:1>), and a corresponding plurality of memory cells storing data received from bit lines (BLe<n:1> and BLo<n:1>) during a programming operation. FIG. 4 illustrates memory cell array 10 shown in FIG. 3 in some additional detail.

Referring now to FIG. 4, memory cell array 10 comprises a plurality of cell strings (Ste<n:1> and STo<n:1>) each respectively connected to one of bit lines (BLe<n:1> and BLo<n:1>). Each cell string in the illustrated example is formed from a string selection transistor (SST) connected to its corresponding bit line, a ground selection transistor (GST) connected to a common source line (CSL), and a plurality of memory cells (MC) connected in series between the string selection transistor (SST) and the ground selection transistor (GST). Bit lines (BLe<n:1> and BLo<n:1>) are electrically connected to page buffer set 200.

Each one of the memory cells (MC) comprises a floating-gate transistor having a source, a drain, a floating gate and a control gate. The memory cells (MC) may be programmed using the Channel Hot Electron (CHE) effect or the Fowler-Nordheim (F-N) tunneling effect. These techniques are both conventionally understood. Respective memory cells (MC) are programmed with a data bit that corresponds to a particular voltage level apparent on bit lines (BLe<n:1> and BLo<n:1>).

Returning to FIG. 3, page buffer set 200 comprises a plurality of page buffers (PBN<n:1>) disposed with respective to corresponding bit lines (BLe<n:1> and BLo<n:1>). Thus, in one embodiment, page buffers (PBN<n:1>) are placed in different connecting positions with respect to memory array 10, but each has essentially the same circuit structure. Accordingly, individual page buffers within the plurality of page buffers will not be distinguished. Rather, each will merely be indicated by use of the reference numeral (PBN) without ordering suffixes such as "n:1".

Figure 5:
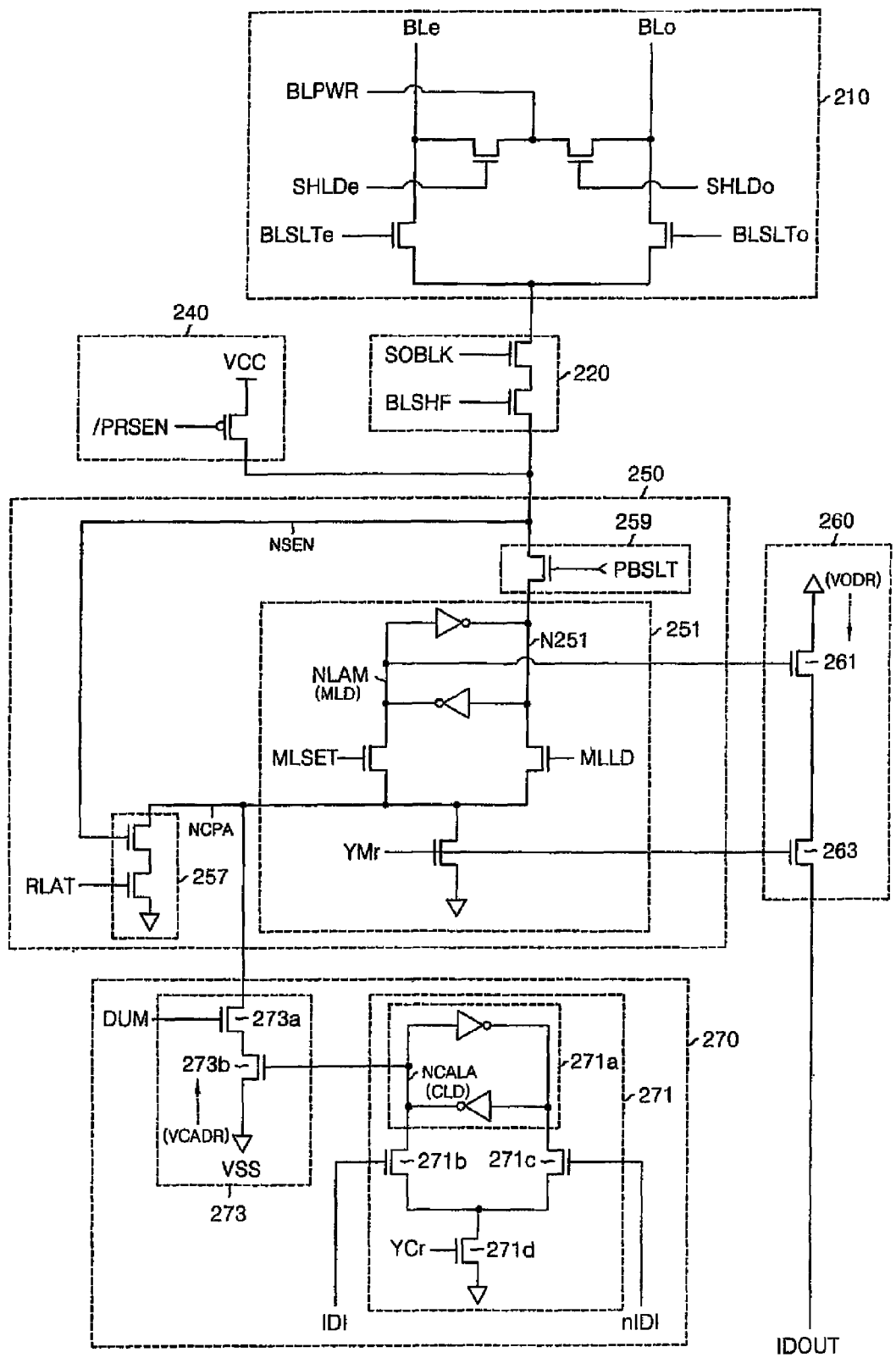
FIG. 5 is a circuit diagram further illustrating a page buffer shown in FIG. 3.

FIG. 5 is a circuit diagram further illustrating an exemplary page buffer (PBN) adapted for use in the memory device illustrated in FIG. 3. Page buffer (PBN) stores data to be transmitted with or received from bit line (BLe or BLo), as 'main latch data' at a main latch node (NLAM). Referring again to FIG. 3, page buffer (PBN) comprises a bit line (BL) bias block 210, a bit line (BL) shielding block 220, a pre-charging block 240, a main latch block 250, an output driver 260, and a cache latch block 270.

BL bias block 210 selects one of two bit lines (BLe and BLo) form the pair of even/odd bit lines and provides a controlled bias voltage to the selected bit line. BL shielding block 220 controls the bit lines (BLe and BLo) to be connected with a sensing node (NSEN) apparent in main latch 250. Precharging block 240 precharges the sensing node (NSEN) to a power source voltage (VCC) in response to a sensing precharge signal (/PRSEN).

The exemplary circuit structures and operations of BL bias block 210, BL shielding block 220, and precharging block 230 may be readily understood by those skilled in the art with reference to FIG. 5, and will not therefore be described in any further detail.

Main latch block 250 comprises main latch node (NLAM). The data value apparent at the main latch node (NLAM) is referred to hereafter as the main latch data (MLD). In the illustrated embodiment, a logical state for the main latch data (MLD) is controlled during a programming operation by the voltage level apparent at a response transmission node (NCPA). As a result, the logical state of the main latch data (MLD) appears on bit line BLe or BLo.

Output driver 260 drives an internal output line (IDOUT) in a unidirectional activation mode of operation in relation to the voltage (i.e., the logic) level of the main latch data (MLD). In other words, the internal output line (IDOUT) is driven to an output driving voltage (VODR), (i.e., ground voltage VSS in the illustrated embodiment) in response to a main latch data (MLD) having a logically high value.

Data driven onto the internal output line (IDOUT) is ultimately transferred to an external device by way of output switch 400. (See, FIG. 3). During this phase of a read operation, the internal output line (IDOUT) is electrically isolated from an input-data transmission path connecting the main latch node (NLAM) with the external device. Thus, the logical condition of the main latch data (MLD) is protected so as not to be affected by the voltage level of the internal output line (IDOUT).

In more detail, each internal output line (IDOUT) may have data driven onto by corresponding main latch data (MLD) within each one of the plurality of the page buffers. Therefore, when one main latch data (MLD) within the plurality of page buffers has a logically high value, its corresponding internal output line (IDOUT), which is connected to the global output line (GDOUT), may be driven at a voltage level consistent with the output driving voltage (VODR) even when the remaining main latch data (MLD) values for the remaining page buffers all have logically low values.

Thus, a memory device comprising a page buffer (PBN) according to one embodiment of the invention may be configured in a wired-OR like structure. As a result, during a verifying operation conducted to confirm a programming state of a selected memory cell (MC), a one-time verifying read-out operation may be performed using the main latch data (MLD) for a plurality of page buffers. In this manner, multiple memory cell data values may be examined in parallel during a verifying operation in order to identify programming defects. Thus, since memory devices configured in accordance with embodiments of the invention comprise a wired-OR type structure, the time required to perform the verifying operation relative to the programmed state of the memory cells may be markedly reduced.

Cache latch block 270 comprises cache latch node (NCALA). In this description, data apparent at the cache latch node (NCALA) will be is referred to as 'cache latch data' (CLD). The value of cache latch data (CLD) is controlled by the logical value of input data provided from an external source. The cache latch data (CLD) is ultimately transferred to the cache latch node (NCALA) in response to a dumping control signal (DUM). Cache latch block 270 is able to load a next data page to be programmed while the main latch data (MLD) is being programmed in a selected memory cell (MC). The next data page is subsequently loaded as the cache latch data (CLD).

Referring here to FIG. 5, main latch block 250 and output driver 260 will be described in some additional detail. Main latch block 250 comprises sensing node (NSEN), a main latch circuit 251, a sense responding circuit 257, and a buffer selection circuit 259. The sensing node (NSEN) holds (or develops) a voltage corresponding to data received from the bit line (BLe or BLo), being electrically connected to the bit line (BLe or BLo) through BL shielding block 220.

Main latch circuit 251 comprises main latch node (NLAM) adapted to hold (or develop) a voltage corresponding to the logical state of the response transmission node (NCPA) as the main latch data (MLD).

Sense responding circuit 257 provides a sense responding voltage (ground or VSS in the illustrated embodiment) to the sense responding node (NCPA) in response to the sensing node (NSEN) and a read latching signal (RLAT). Buffer selection circuit 259 resultantly provides data which corresponds to the main latch data (MLD) to the bit line (BLe or BLo) by way of the sensing node (NSEN).

Output driver 260 connects the internal output line (IDOUT) to communicate the main latch data (MLD) during a read operation. In the illustrated example, output driver 260 comprises a first output driving transistor 261 and a second output driving transistor 263. First output driving transistor 261 is gated by the main latch data (MLD). Namely, first output driving transistor 261 is turned ON when the main latch data (MLD) is set to a logical high level. Second output driving transistor 263 is gated by a main-latch selection address signal (YMr), thereby driving the internal output line (IDOUT) to the ground voltage (VSS).

Thus, in the illustrated embodiment, when the main latch data (MLD) is set to a logical high, the internal output line (IDOUT) is driven to ground voltage (VSS) in response to the logical high level transition of the main-latch address selection signal (YMr).

Cache latch block 270 comprises of a cache latch circuit 271 and a cache dumping circuit 273. Cache latch circuit 271 comprises the cache latch node (NCALA), and stores the cache latch data (CLD), which corresponds to the input data supplied from the external source to the cache latch node (NCALA). Cache dumping circuit 273 responds to the dumping control signal (DUM), providing a cache drive voltage (VCADR) to the response transmission mode in accordance with data condition at the cache latch node (NCALA).

In one embodiment, cache latch circuit 271 comprises a cache latch 271a, a first cache latch transistor 271b, and a second cache latch transistor 271c. Cache latch 271a stores data apparent on first and second internal input line (IDI and nIDI) at the cache latch node (NCALA).

In the illustrated example, first cache latch transistor 271b is gated in accordance with a logical state of the data apparent on first internal input line (IDI), thereby enabling data having a logical low value to be stored at the cache latch node (NCALA). In contrast, second cache latch transistor 271c is gated in accordance with a logical state of data apparent on the second internal input line (nIDI), thereby enabling data having a logical high value to be stored at the cache latch node NCALA.

In this regard, the first and second internal input lines (IDI and nIDI) are alternatively activated in accordance with the input data. In the illustrated example, the first internal input line (IDI) is activated by a logical high value in order to control the bit line (BLe or BLo) during a program-inhibit operation or condition. When the bit line (BLe or BLo) is connected to a memory cell MC to be programmed, the second internal input line (nIDI) is activated to a logical high value.

In the illustrated example, cache latch circuit 271 further comprises a cache-driving transistor 271d. Cache driving transistor 271d is gated in response to a cache latch selection address (YCr). Here, the cache latch selection address (YCr) becomes active when cache latch circuit 271 loads data and selects one of the plurality of page buffers commonly connected to the internal output line (IDOUT).

Cache dumping circuit 273 comprises first and second cache dumping transistors, 273a and 273b, connected in series between the terminal of the cache drive voltage (VCADR) and the response transmission node (NCPA). Cache dumping circuit 273, as driven by the data state of the cache latch node (NCALA), transfers the cache drive voltage (VCADR) to the response transmission node (NCPA) and resultantly controls the data correspondingly stored at the main latch node (NLAM).

The illustrated example assumes that the cache drive voltage (VCADR) is defined as the ground voltage (VSS), and further assumes that first and second cache dumping transistors, 273a and 273b, are NMOS transistors gated respectively in response to the dumping control signal (DUM) and a state of the cache latch node (NCALA).

Returning now to FIG. 3, the memory device further comprises input data controller 300 and output switch 400. Input data controller 300 is enabled in response to a block decoding signal (/BLDEC) having a logical low value. Here, the block decoding signal (/BLDEC) is provided to specifically designate the internal output line (IDOUT). In other words, the block decoding signal (/BLDEC) is an address signal to select the page buffers (e.g., page buffer set 200) connected to a single internal output line (IDOUT).

Input data controller 300 activates one of the first and second internal input lines (IDI and nIDI) in correspondence with data on the first and second global input lines (GDI and nGDI). Data on the first and second input lines (IDI and nIDI) is provided to cache latch block 270. Here, the data on the first and second global input lines (GDI and nGDI) correspond to the input data, however, being logically complementary in the illustrated example.

Therefore, either the first internal input line (IDI) or the second internal input line (nIDI) is activated in accordance with the input data. As a result, data corresponding to the input data is provided to cache latch block 270.

Output switch 400 electrically connects the internal output line (IDOUT) to the global output line (GDOUT) in response to a wired-ORing signal (/WOREN) and a block decoding signal (/BLDEC). Here, the wired-ORing signal (/WOREN) is activated at a logical low value in a wired-OR operation that simultaneously verifies data from all page buffers connected to a single internal output line (IDOUT). The block decoding signal (/BLDEC) designates the internal output line (IDOUT).

Therefore, output switch 400 electrically connects the internal output line (IDOUT) to the global output line (GDOUT) during the wired-OR operation mode when page buffer set 200 is selected by the block decoding signal (/BLDEC).

Figure 6:
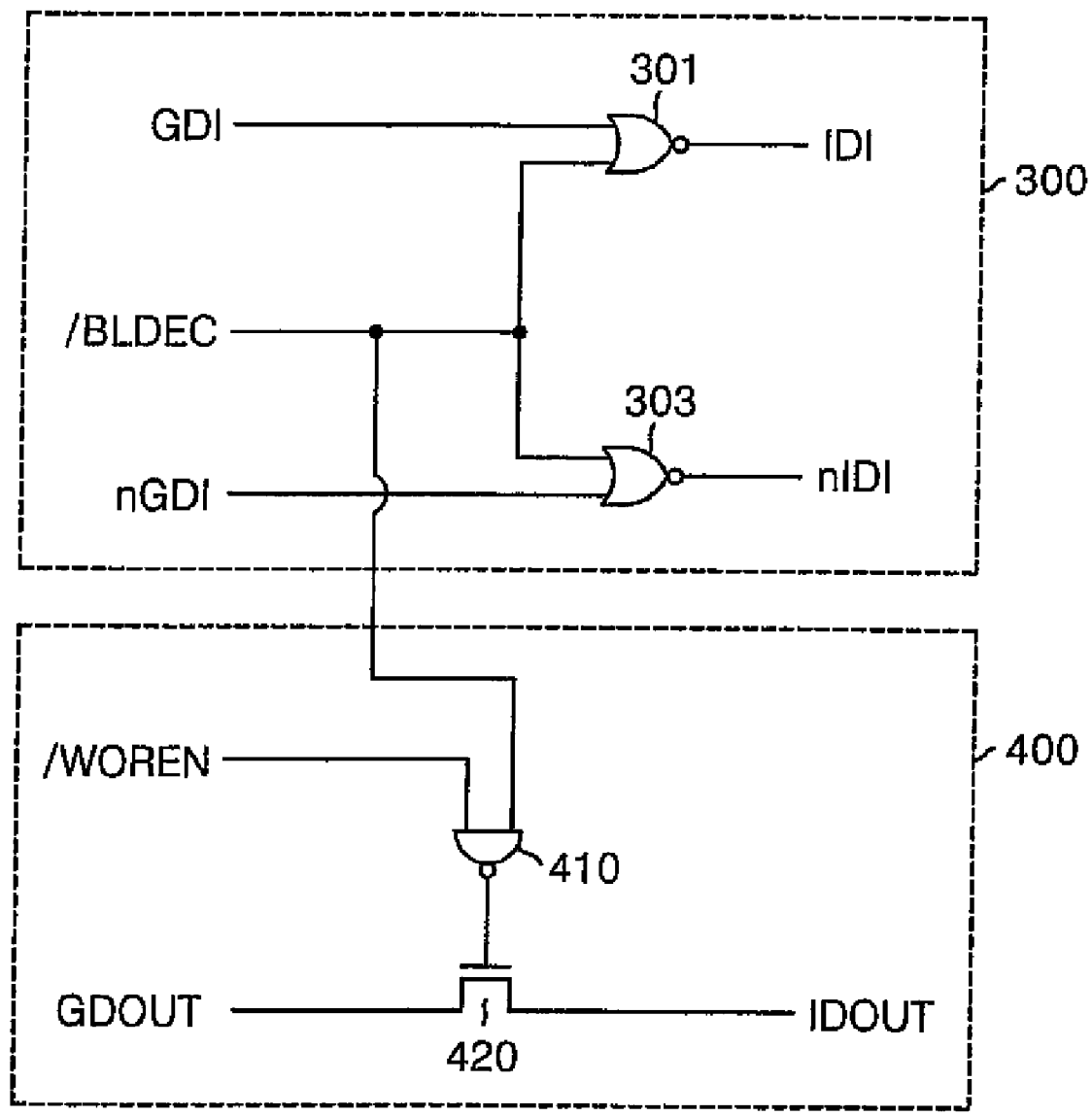
FIG. 6 is a diagram further illustrating an input data controller and an output switch shown in FIG. 3.

FIG. 6 is a diagram further illustrating the input data controller 300 and the output switch 400 shown in FIG. 3. Referring to FIG. 6, input data controller 300 comprises first and second decoder-logic gates 301 and 302.

First decoder-logic gate 301, being enabled by the block decoding signal (/BLDEC), inverts data from the first global input line (GDI) and provides the inverted data to the first internal input line (IDI). Second decoder-logic gate 302, being enabled by the block decoding signal (/BLDEC), inverts data from the second global input line (nGDI) and provides the inverted data to the second internal input line (nIDI).

Output switch 400 comprises a switching logic gate 410 and a switching transistor 420. Switching logic gate 410 logically multiplies the block decoding signal (/BLDEC) by the wired-ORing signal (/WOREN) and thereby generates a switch control signal (SW) to regulate the switching transistor 420.

Switching transistor 420 provides data from the internal output line (IDOUT) to the global output line (GDOUT) when the block decoding signal (/BLDEC) or the wired-ORing signal is activated at a logical low value.

An exemplary data loading operation relative to cache latch block 270 and an exemplary data dumping operation relative to main latch block 250 will now be described.

Figure 7:
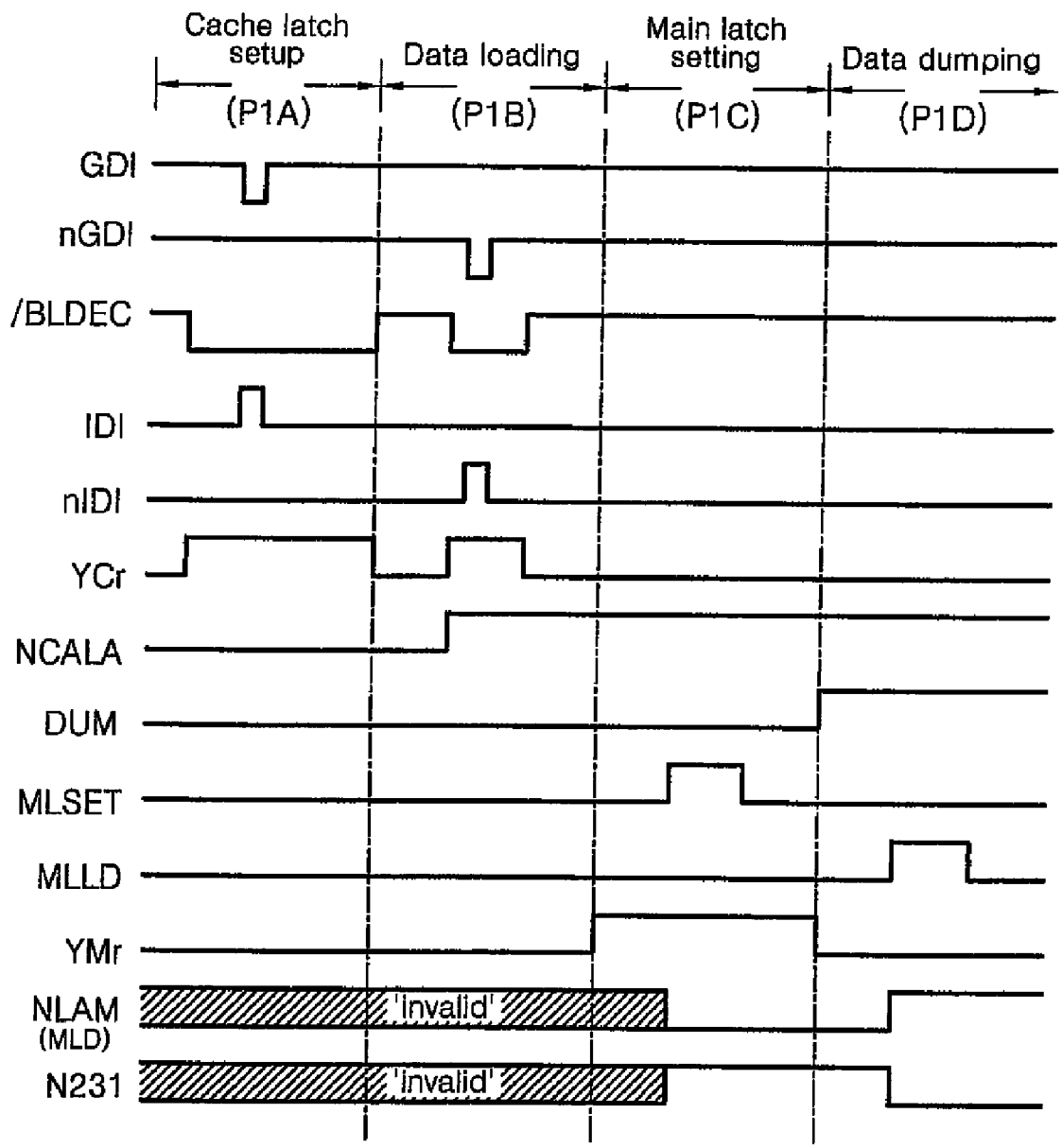
FIG. 7 is a timing diagram illustrating features of leading signals and nodes in relation to a programming operation for the nonvolatile semiconductor memory device, and more particularly in relation to a bit line programmable condition.
Figure 8:
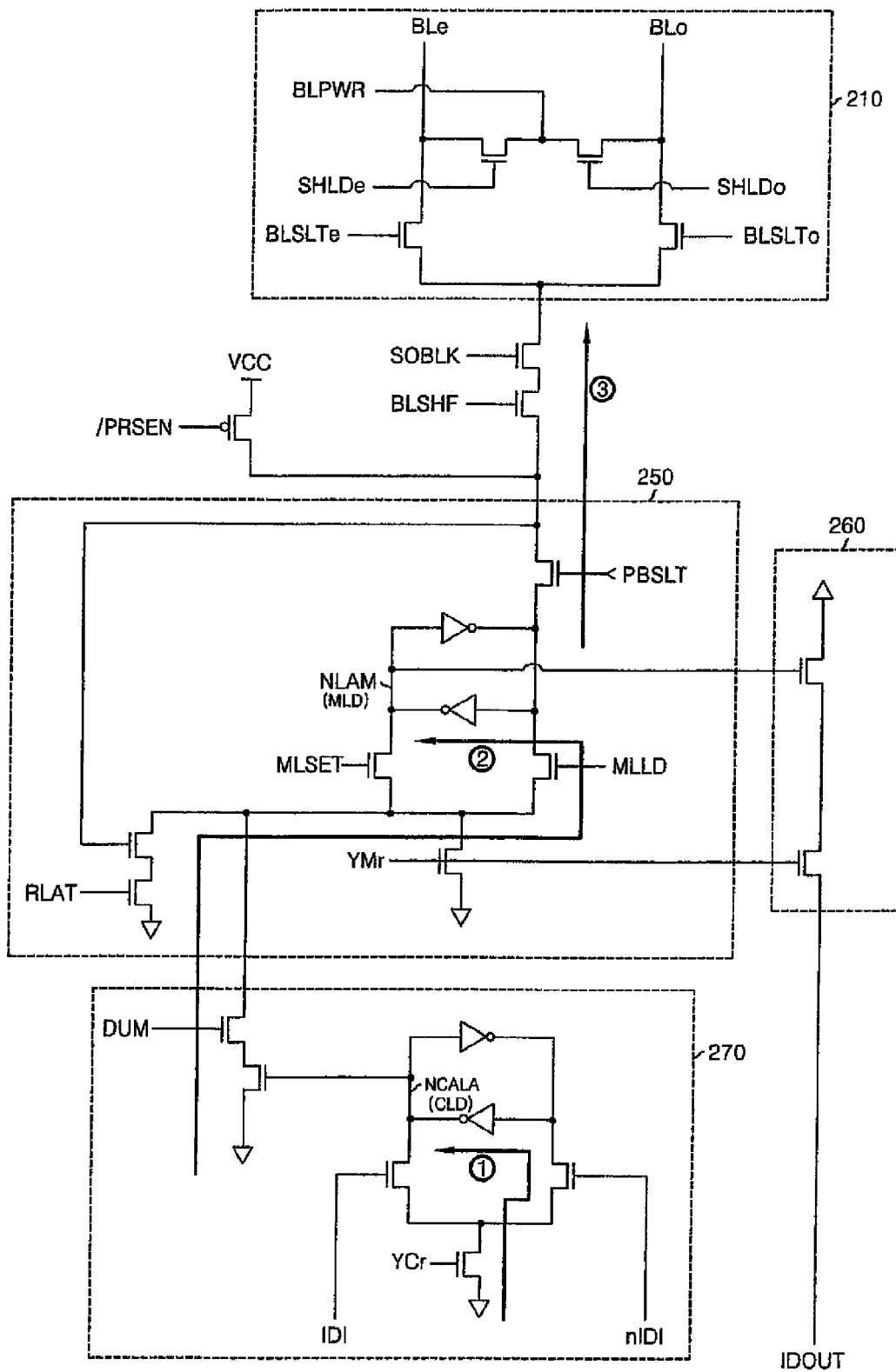
FIG. 8 is a diagram further illustrating data flow in accordance with the programming operation shown by FIG. 7.

FIG. 7 is a timing diagram illustrating circuit features, such as signals and nodes, during a data dumping period of an exemplary programming operation for a memory device. The diagram assumes a bit line set in a programmable condition. FIG. 8 is a complementary diagram relative to FIG. 7 illustrating data flow in accordance with the exemplary programming operation.

Referring to FIG. 7, if the cache latch selection address (YCr) and the first internal input line (IDI) are both logically high during a cache latch setup period (P1A), then cache latch node (NCALA) will be logically low. During a following data loading period (P1B), the cache latch selection address (YCr) and the second internal input line (nIDI) transition to logically high. Accordingly, the cache latch node (NCALA) transitions to logical high from logically low. (See, signal path "1" identified in FIG. 8).

During a following main latch setup period (P1C), when the main latch selection address (YMr) and main latch setting signal (MLSET) become logically high, the main latch node (NLAM) becomes logically low. Thereafter, during data dumping period (P1D), when the dumping control signal (DUM) transitions to logically high, cache transmission circuit 273 in cache latch block 270 forms a current path to place the response transmission node (NCPA) logically low.

When the main latch selection address (YMr) and main latch loading signal (MLLD) both become logically high, the main latch node (NLAM) transitions to logically high from logically low. (See, signal path "2" in FIG. 8). Data corresponding to the main latch node (NLAM), (i.e., logically low data apparent at node N231), is reflected on bit line (BLe or BLo), by which the bitline (BLe or BLo) is placed in a programmable condition. (See, signal path 3 in FIG. 8).

Figure 9:
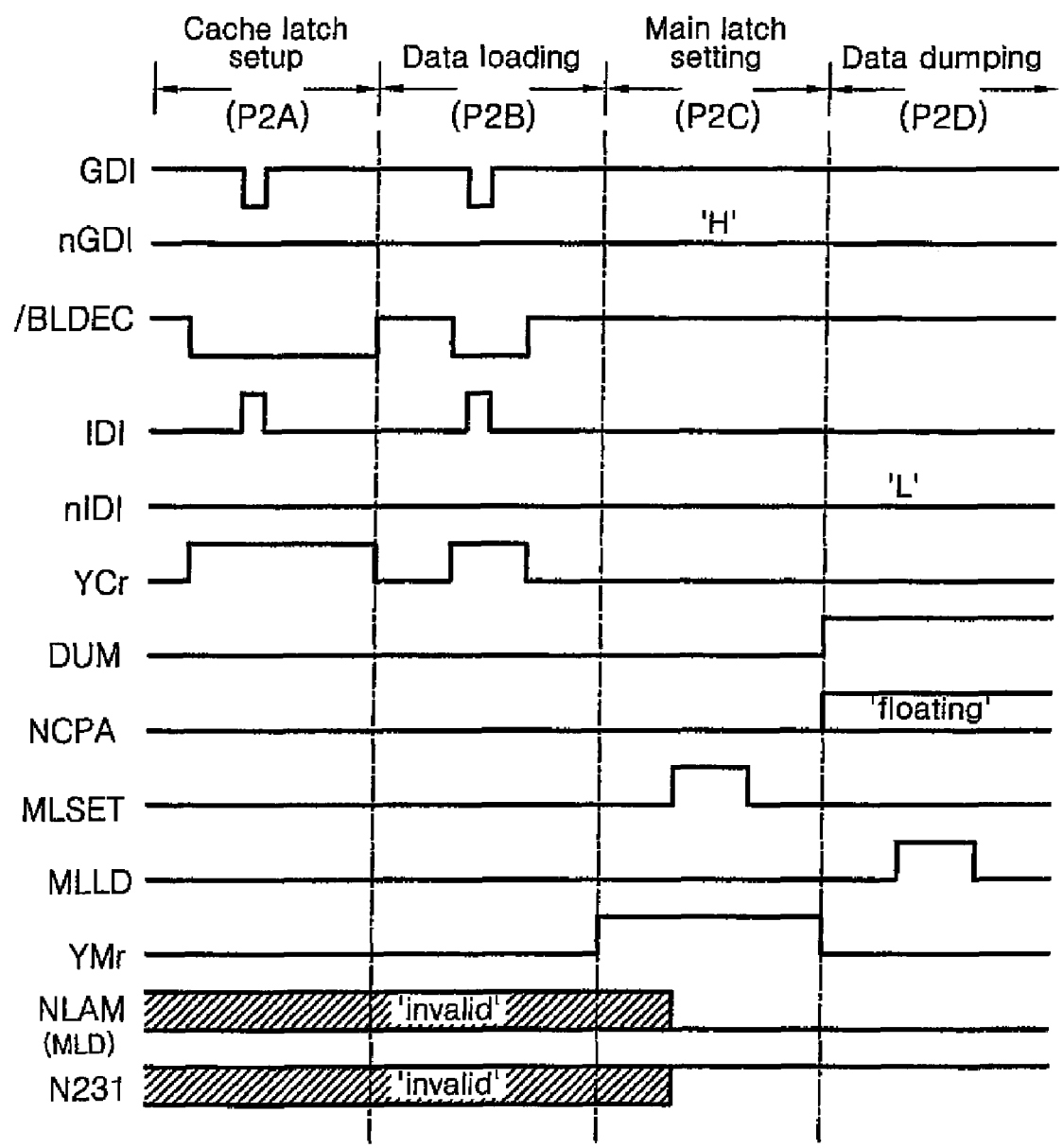
FIG. 9 is a timing diagram illustrating features of leading signals and nodes in relation to a programming operation for the nonvolatile semiconductor memory device, and more particularly in relation to a bit line program-inhibit condition.
Figure 10:
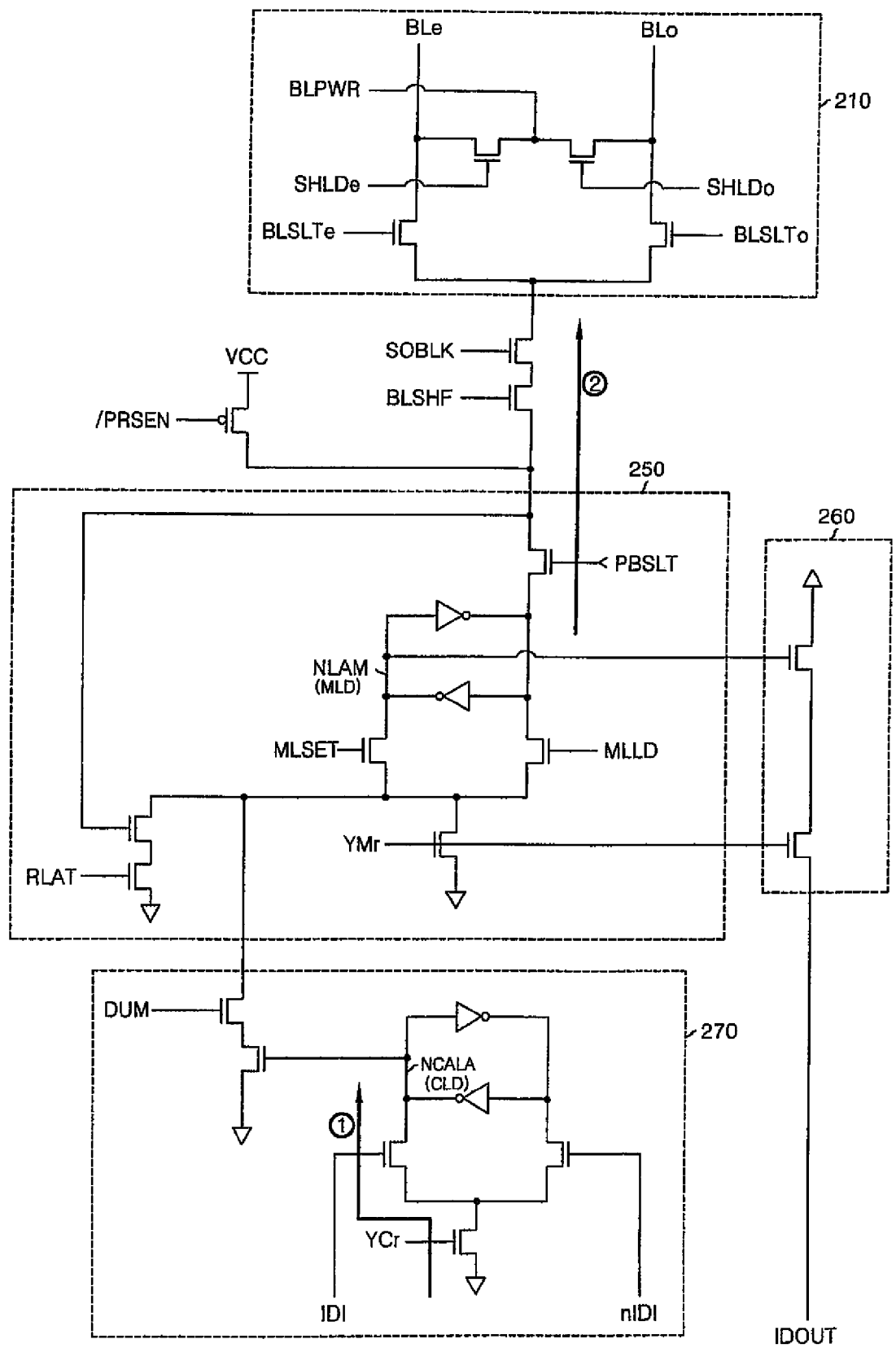
FIG. 10 is a diagram further illustrating data flow in accordance with the programming operation shown by FIG. 9.

A program-inhibit operation or condition adapted to control the bit line will now be described. FIG. 9 is a timing diagram illustrating circuit features, such as signals and nodes, during a data dumping period of an exemplary programming operation for a memory device. The diagram assumes a bit line set in a program-inhibit condition. FIG. 10 is a complementary diagram relative to FIG. 9 illustrating data flow in accordance with the exemplary programming operation.

As with the cache latch setup period (P1A) of FIG. 7, the cache latch node (NCALA) is set up to logically low in a cache latch setup period (P2A). During a following data loading period (P2B), the cache latch selection address (YCr) and first internal input line (IDI) become logically high, such that the cache latch node (NCALA) transitions to a logical high from a logical low. (See, signal path "1" in FIG. 10).

During a following main latch setup period (P2C), as in the main latch setup period (P1C) of FIG. 7, when the main latch selection address (YMr) and main latch setting signal (MLSET) transition to logically high, the main latch node (NLAM) transitions to logically low. Following this, during the data dumping period (P2D), even if the dumping control signal (DUM) transitions to a logical high, the cache transmission circuit 273 of cache latch block 270 does not form the foregoing current path, because the cache latch node (NCALA) is logically low. Thus, the response transmission node (NCPA) is placed in a floating state. In this case, even though the main latch selection address (YMr) and main latch loading signal (MLLD) transition to a logical high, the main latch node (NLAM) maintains a logical low. Thus, data corresponding to the main latch node (NLAM), (i.e., logically high data apparent at node N231), is placed on the bit line (BLe or BLo), by which the bit line (BLe or BLo) is controlled during the program-inhibit condition. (See, signal path 2 in FIG. 10).

Figure 11:
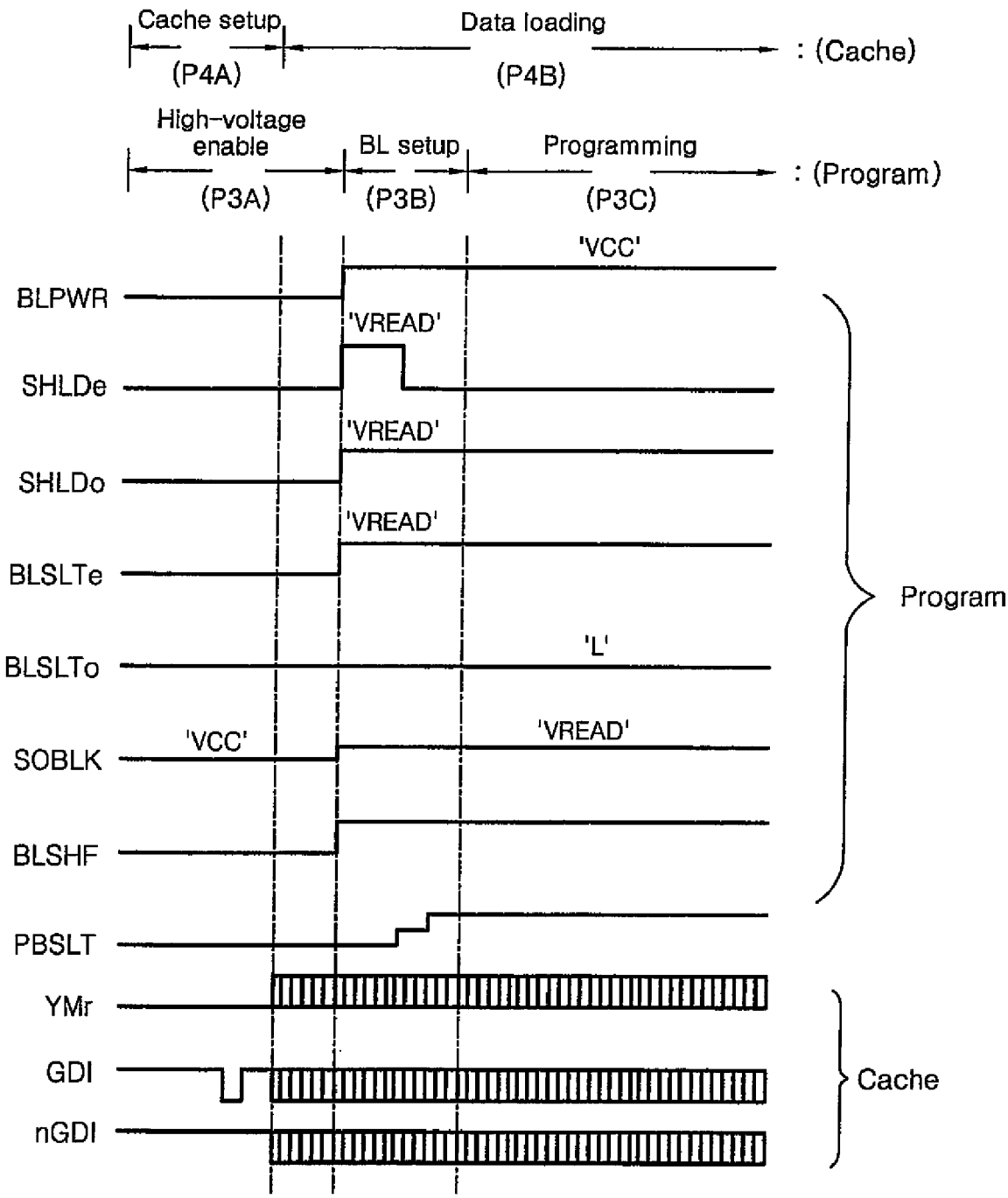
FIG. 11 is a timing diagram illustrating features of leading signals and nodes in relation to a programming operation for the nonvolatile semiconductor memory device.

FIG. 11 is a timing diagram further illustrating circuit features, such as signals and nodes, following the data dumping period of an exemplary programming operation for a memory device.

Referring to FIG. 11, after the data dumping period (P1D or P2D) of FIG. 7 or FIG. 9 respectively, the operation proceeds to a high-voltage enabling period (P3A), a bit line setup period (P3B), and a programming period (P3C). According to the illustrated timing features shown in FIG. 11, even bit line BLe is assumed to be in a programmable condition while odd bit line BLo is assumed to be in a program-inhibit condition. With these assumptions, a selected memory cell is programmed by transferring data from the main latch node (NLAM) to the bit line (BLe or BLo), and the next data to be programmed is being loaded into cache latch block 270 for each page buffer. After completing the programming operation for the selected memory cells with the data stored in the main latch node (NLAM), the data stored in cache latch blocks 270 of the page buffers is simultaneously dumped to main latch blocks 250.

As already noted, the memory device susceptible to the advantages provided by the present invention often includes a cache function. The program-verifying operation normally at part of this function will now be described in the context of one embodiment of the invention.

Figure 12:
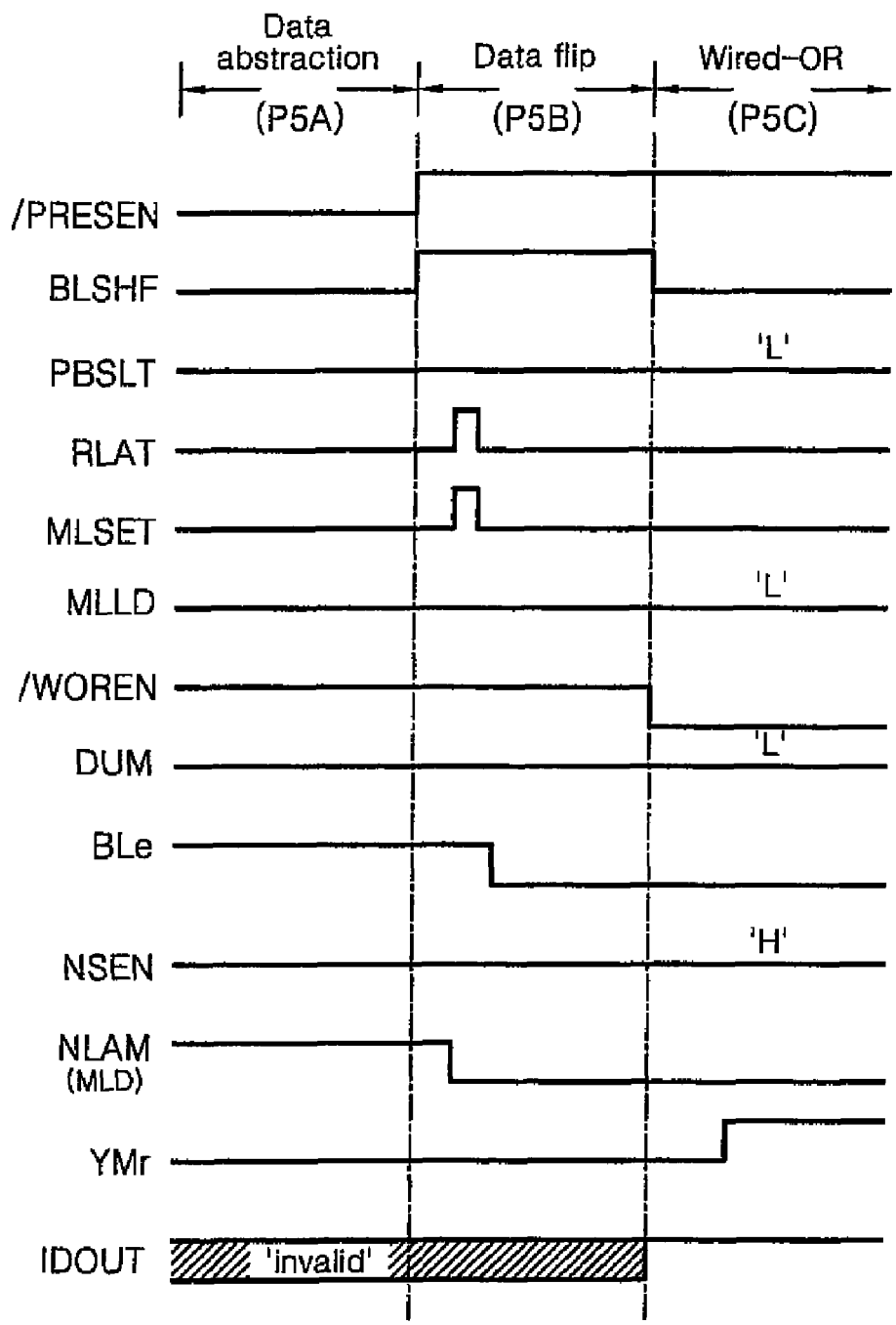
FIG. 12 is a timing diagram illustrating features of leading signals and nodes in relation to a verifying operation for the nonvolatile semiconductor memory device, and more particularly in relation to a program state for a memory cell when sensed as "PASS"
Figure 13:
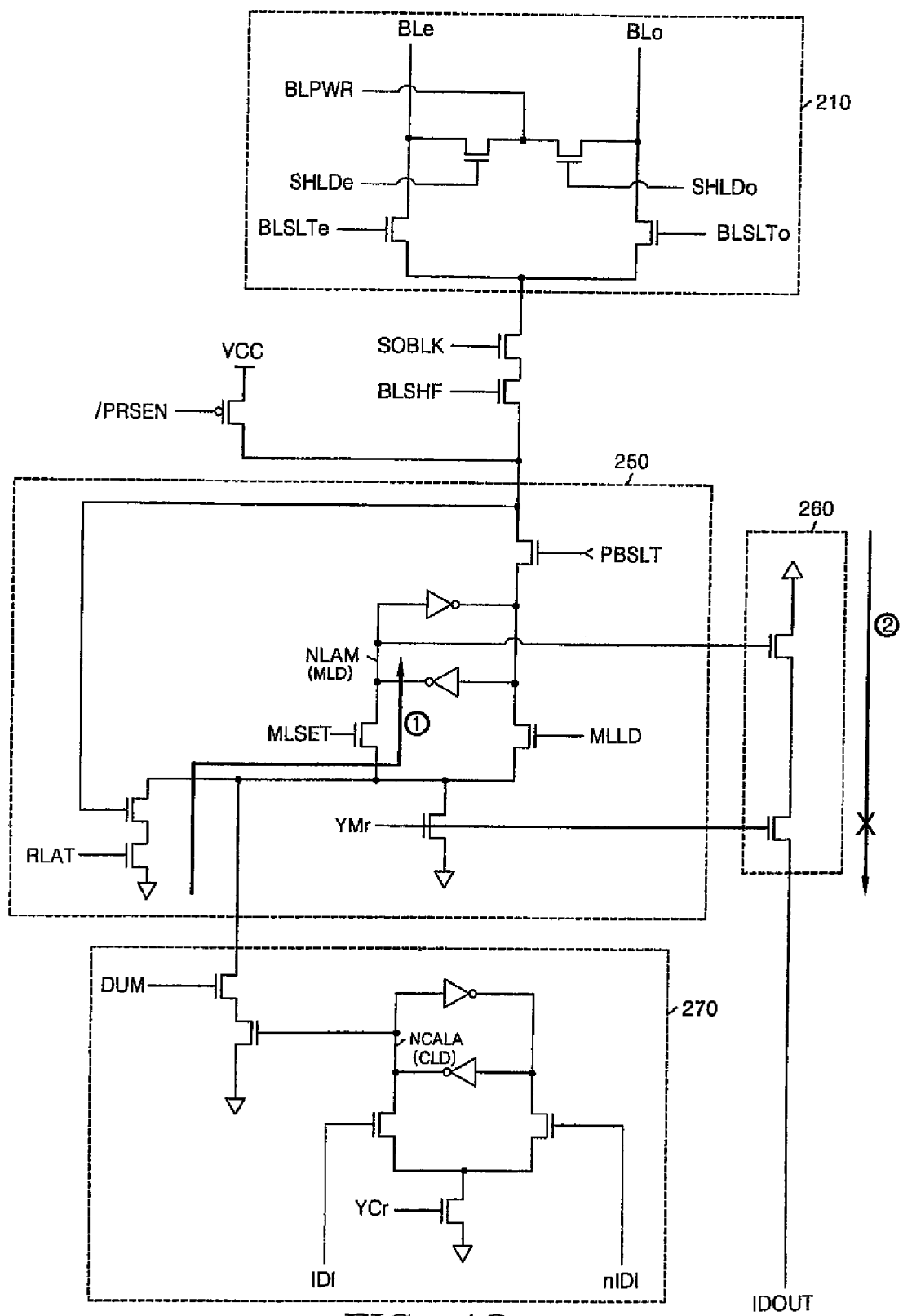
FIG. 13 is a diagram further illustrating data flow in accordance with the verifying operation shown by FIG. 12.

FIG. 12 is a timing diagram illustrating circuit features, such as signals and nodes, leading up to the data dumping period of an exemplary verifying operation of a larger programming operation for a memory device. A "PASS" program state for a subject memory cell is assumed. FIG. 13 is a complementary diagram relative to FIG. 12 illustrating data flow in accordance with the exemplary programming operation.

Referring to FIG. 12, during a data abstraction period (P5A), if a sensing precharge signal (/PRESEN) transitions to a logical low, the sensing node (NSEN) is precharged to the power source voltage (VCC). During this time period, the main latch data (MLD) is set to a logical high. Since the program state for the selected memory cell is detected as 'PASS', the bit line (BLe or BLo) almost maintains its current state.

Thereafter, during a data transition (or "flip") period (P5B), even when a BL shielding signal (BLSHF) transitions to a logical high, the sensing node (NSEN) retains essentially the power source voltage (VCC). During this time period, if the read latch signal (RLAT) and main latch setting signal (MLSET) transition to a logical high, the main latch node (NLAM) flips to a logical low from a logical high. (See, signal path "1" in FIG. 13).

During a following wired-OR period (P5C), even when the main latch address (YMr) transitions to a logical high, the internal output line (IDOUT) is not driven to the level of ground voltage (VSS). (See, signal path "2" in FIG. 13). Additionally during this time period, the wired-ORing signal (/WOREN) transitions to a logical low. In this case, although the global output line (GDOUT) is connected to the internal output line (IDOUT), the global output line (GDOUT) maintains its precharged level at a logical high. As such, by confirming that the global output line (GDOUT) is logically high, the memory device verifies all of the memory cells to be programmed are remain in a "PASS" programming state.

Figure 14:
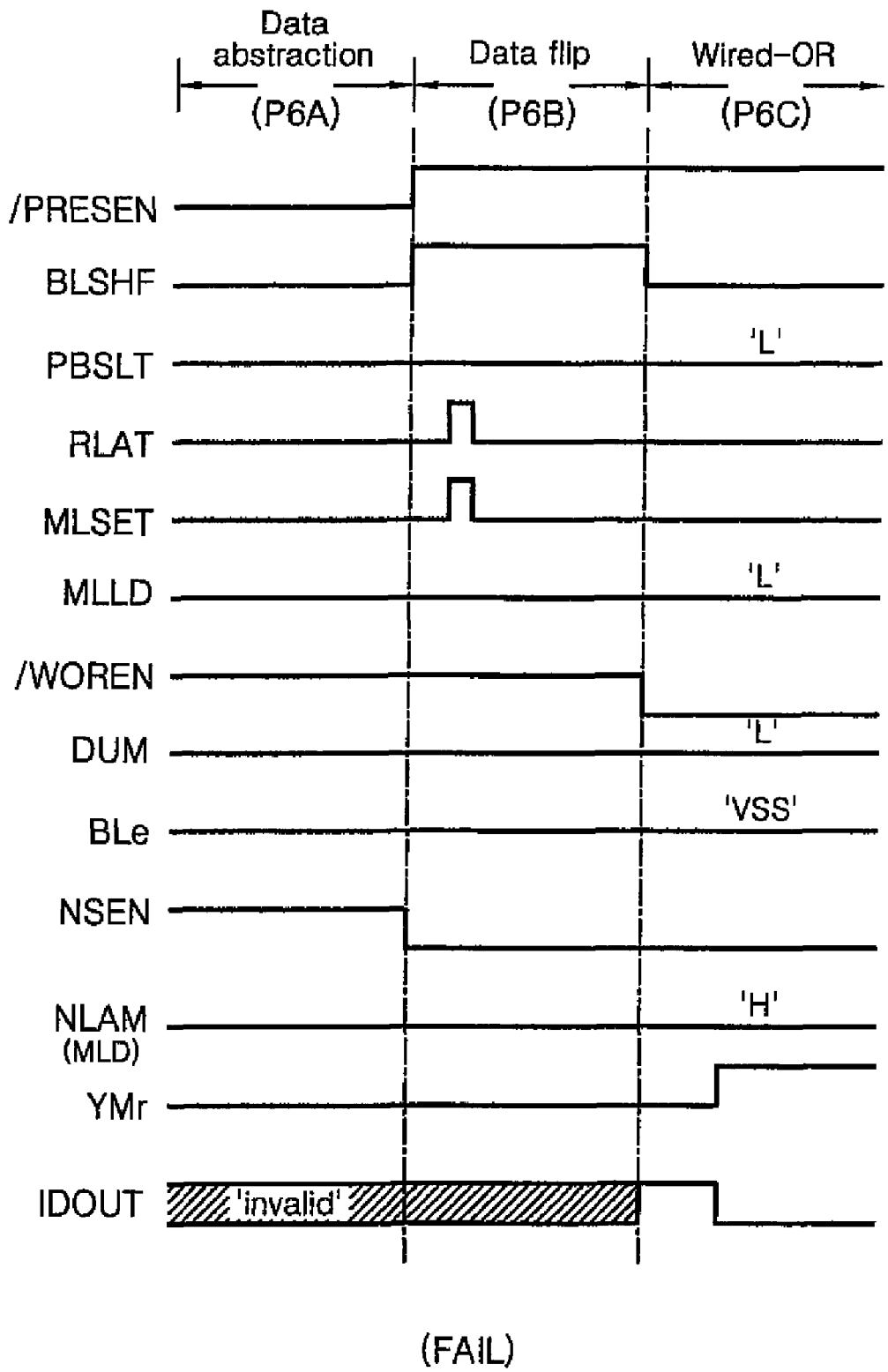
FIG. 14 is a timing diagram illustrating features of leading signals and nodes in relation to a verifying operation for the nonvolatile semiconductor memory device, and more particularly in relation to a program state for a memory cell when sensed as "FAIL"; and, FIG. 15 is a diagram further illustrating data flow in accordance with the verifying operation shown by FIG. 15.
Figure 15:
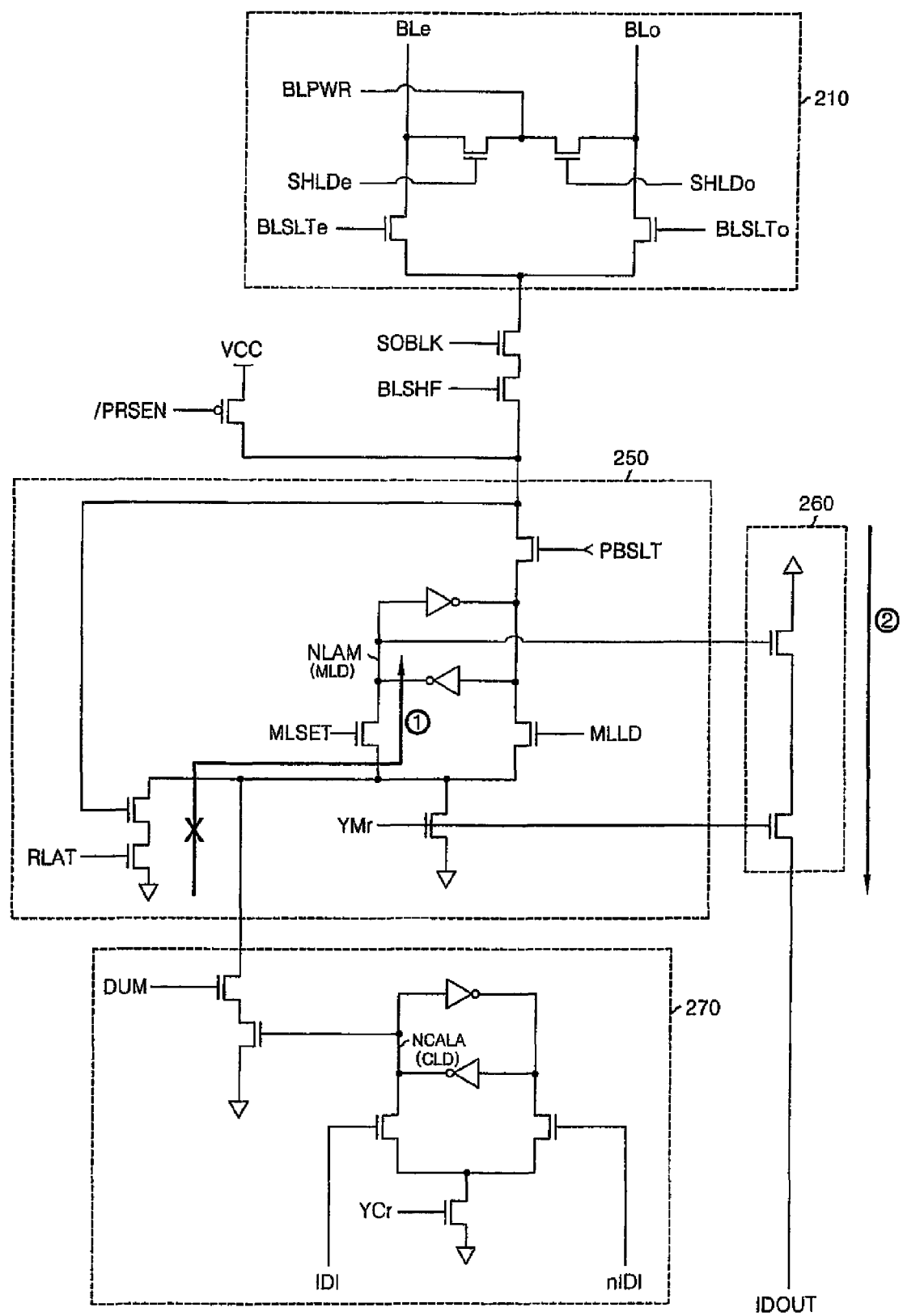

FIG. 14 is a timing diagram illustrating circuit features, such as signals and nodes, leading up to the data dumping period of an exemplary verifying operation of a larger programming operation for a memory device. A "FAIL" program state for a subject memory cell is assumed. FIG. 15 is a complementary diagram relative to FIG. 14 illustrating data flow in accordance with the exemplary programming operation.

Referring to FIG. 14, during the data abstraction period (P6A), the sensing node (NSEN) is precharged to the power source voltage (VCC) and the main latch data (MLD) is set to a logical high. As the program state of the selected memory cell is detected as 'FAIL', a current pass is formed toward the ground voltage VSS through the bitline (BLe or BLo).

Thereafter, during the data flip period (P6B), when the BL shielding signal (BLSHF) transitions to a logical high, the sensing node (NSEN) goes to the ground voltage VSS. During this time period, even if the read latch signal (RLAT) and main latch setting signal (MLSET) transition to logical highs, the main latch node (NLAM) does not flip but maintains a logical high. (See, signal path "1" in FIG. 14).

During the following wired-OR period (P6C), when the main latch address (YMr) transitions to a logical high, the internal output line (IDOUT) is driven to the ground voltage VSS. (See, signal path "2" in FIG. 15). After this, if the wired-ORing signal (/WOREN) transitions to a logical low, the global output line (GDOUT) becomes logically low. As such, by confirming that the global output line (GDOUT) is logically low, the memory device may verify that at least one of memory cells to be programmed is a "FAIL" programming state.

As such, the verifying operation for a memory device consistent embodiments of the invention are able to operate in a wired-OR mode to simultaneously verify data stored in a plurality of programmed memory cells. Thus, the time required to verify the programming state of the memory device is remarkably reduced.

In one aspect, a memory device consistent with embodiments of the invention embeds a cache latch block adapted for use in the cache function. With the cache latch block, data loading time for all data pages after a first data page may be greatly shortened.

Moreover, a memory device consistent with embodiments of the invention may include the output driver adapted to enable an internal output line for unidirectional data transmission during program-verifying operation using the wired-OR scheme. As a result, it remarkably reduces a time for verifying the programming state of the memory device.

Although the present invention has been described in connection with several teaching embodiments, it is not limited thereto. It will be apparent to those skilled in the art that various substitutions, modifications and changes may be thereto without departing from the scope of the invention as defined by the following claims.

What is claimed is:

1. A method of programming a nonvolatile semiconductor memory device, the method comprising:
   providing a memory cell array including a plurality of memory cells, each memory cell storing data programmed via a corresponding bit line;
   providing a plurality of page buffers, each page buffer storing data apparent on a corresponding bit line and comprising a main latch block storing a main latch data;
   providing a cache latch block storing a cache latch data;
   providing an output driver gated by the main latch data and unidirectionally driving an internal output line to an output driving voltage in accordance with a logic level of the main latch data;
   loading cache latch data into a cache latch block of a page buffer in accordance with a logical state of input data provided by an external source;
   dumping main latch data into a main latch block of the page buffer in accordance with the cache latch data;
   programming a memory cell of a memory cell array of the nonvolatile semiconductor memory device with a corresponding bit line in accordance with the main latch data; and
   loading next data in the cache latch block during the programming of the memory cell.

2. The method of claim 1, further comprising:
   storing the cache latch data in a cache latch circuit of the cache latch block; and
   providing a cache drive voltage to the main latch block in accordance with the stored cache latch data and in response to the dumping control signal.

3. The method of claim 2, wherein the cache latch circuit comprises; a cache latch comprising the cache latch node, a first cache latch transistor and a second cache latch transistor, and the method further comprises:
   gating the first cache latch transistor in response to a first internal input line, whereby the cache latch data having a first logical state is provided at the cache latch node; and
   gating the second cache latch transistor in response to a second internal input line, whereby the cache latch data having a second logical state is provided at the cache latch node, wherein the second logical state is the inverse with the first logical state,
   wherein the first and second internal input lines are respectively activated in the first and second logical states in accordance with the input data.

4. A method of programming a nonvolatile semiconductor memory device comprising:
   storing data apparent on a corresponding bit line in a page buffer, the page buffer having a main latch block storing main latch data and driving the corresponding bit line in accordance with the main latch data, and a cache latch block storing cache latch data and providing the cache latch data to the main latch block in response to a dumping control signal;
   unidirectionally driving an internal output line connected to an output switch with an output driving voltage in accordance with the main latch data using an output driver, wherein the output driver comprises an output driving transistor driving the internal output line and being gated by the main latch data; and
   wherein the internal output line is connected to a global output line to drive the global output line with the output driving voltage.

5. The method of claim 4, further comprising:
   logically controlling first and second internal input lines provided to the cache latch block, wherein the first and second internal input lines control the cache latch data in accordance with input data received by the nonvolatile semiconductor memory device.

6. A method of programming a nonvolatile semiconductor memory device, the method comprising:
   providing a memory cell array including a plurality of memory cells, each memory cell storing data of corresponding bit line;
   providing a plurality of page buffers storing corresponding main latch data, wherein each page buffer comprises an output driver gated by the corresponding main latch data and unidirectionally driving an internal output line to an output driving voltage in accordance with a logic level of the corresponding main latch data;
   providing a global output line transmitting data in accordance with a driving result of the internal output line;
   reflecting a voltage of the corresponding bit line on the corresponding main latch data of the plurality of page buffers;
   driving the internal output line in response to the main latch data of the plurality of page buffers, wherein a logical state of the internal output line is determined by at least one of the main latch data of the plurality of page buffers,
   wherein driving the internal output line in response to the main latch data of the plurality of page buffers discharges the global output line in response to the logical state of the internal output line after precharging the global output line.

* * * * *